(12) United States Patent
Nam et al.

(10) Patent No.: US 12,462,747 B2
(45) Date of Patent: *Nov. 4, 2025

(54) DISPLAY DEVICE

(71) Applicant: Samsung Display Co., LTD., Yongin-si (KR)

(72) Inventors: Hui Nam, Suwon-si (KR); Hae-Kwan Seo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/370,868

(22) Filed: Sep. 20, 2023

(65) Prior Publication Data

US 2024/0016003 A1 Jan. 11, 2024

Related U.S. Application Data

(63) Continuation of application No. 17/242,306, filed on Apr. 28, 2021, now Pat. No. 11,800,748.

(30) Foreign Application Priority Data

Oct. 12, 2020 (KR) .......................... 10-2020-0131323

(51) Int. Cl.
*G09G 3/3233* (2016.01)
*G09G 3/20* (2006.01)
(Continued)

(52) U.S. Cl.
CPC .......... *G09G 3/3233* (2013.01); *G09G 3/2003* (2013.01); *H10K 59/1213* (2023.02);
(Continued)

(58) Field of Classification Search
CPC ..... G09G 2330/021; G09G 2300/0426; G09G 2300/0452; G09G 2300/0866; G09G 3/3233; H10K 50/81; H01L 27/1214
See application file for complete search history.

(56) References Cited

U.S. PATENT DOCUMENTS 11,800,748 B2 * 10/2023 Nam .................... H10K 59/131
2004/0239846 A1 * 12/2004 Wen .................... G02F 1/13624
349/114

(Continued)

FOREIGN PATENT DOCUMENTS

JP 7122712 B2 12/1995
JP 200010123 A 1/2000
(Continued)

*Primary Examiner* — Shaheda A Abdin
(74) *Attorney, Agent, or Firm* — CANTOR COLBURN LLP

(57) ABSTRACT

A display device includes: scan lines extending in a first direction; first data lines, second data lines, and third data lines extending in a second direction; a first driving unit connected to the scan lines and the first data lines; a first light emitting unit connected to the first driving unit; a second driving unit connected to the scan lines and the second data lines; a second light emitting unit connected to the second driving unit; a third driving unit connected to the scan lines and the second data lines; and a third light emitting unit connected to the third driving unit. The first light emitting unit overlaps the second driving unit or the third driving unit, the second light emitting unit overlaps the first driving unit or the third driving unit, and the third light emitting unit overlaps the first driving unit or the second driving unit.

19 Claims, 9 Drawing Sheets

(51) Int. Cl.
    *H10K 59/121* (2023.01)
    *H10K 59/131* (2023.01)
    *H10K 59/35* (2023.01)
    *H10D 86/40* (2025.01)
    *H10D 86/60* (2025.01)

(52) U.S. Cl.
    CPC ........... *H10K 59/131* (2023.02); *H10K 59/35* (2023.02); *G09G 2300/0426* (2013.01); *G09G 2300/0452* (2013.01); *G09G 2330/021* (2013.01); *H10D 86/40* (2025.01); *H10D 86/60* (2025.01)

(56) References Cited

U.S. PATENT DOCUMENTS

| | | | | |
|---|---|---|---|---|
| 2005/0110723 | A1* | 5/2005 | Shin | G09G 3/3233 345/76 |
| 2006/0007073 | A1* | 1/2006 | Kwak | G09G 3/3233 345/76 |
| 2012/0050630 | A1* | 3/2012 | Sato | G02F 1/134336 349/33 |
| 2014/0362320 | A1* | 12/2014 | Sato | G02F 1/134336 349/43 |
| 2016/0321993 | A1 | 11/2016 | Choi et al. | |
| 2018/0031893 | A1* | 2/2018 | Tamaki | G02F 1/133504 |
| 2020/0083302 | A1 | 3/2020 | Park et al. | |

FOREIGN PATENT DOCUMENTS

| | | |
|---|---|---|
| JP | 20044725 A | 1/2004 |
| KR | 1020110078387 A | 7/2011 |
| KR | 1020160024316 A | 3/2016 |
| KR | 1020160051154 A | 5/2016 |
| KR | 1020200030222 A | 3/2020 |

* cited by examiner

DISPLAY DEVICE

This application is a continuation of U.S. patent application Ser. No. 17/242,306, filed on Apr. 28, 2021, which claims priority to Korean Patent Application No. 10-2020-0131323 filed on Oct. 12, 2020, and all the benefits accruing therefrom under U.S.C. § 119, the content of which in its entirety is herein incorporated by reference.

BACKGROUND

1. Field

The present disclosure relates to a display device.

2. Description of the Related Art

An organic light emitting diode ("OLED") display includes two electrodes and an organic emission layer interposed therebetween. Electrons injected from one electrode and holes injected from the other electrode are combined in the organic emission layer to generate excitons. The generated excitons are changed to a ground state from an excited state, releasing energy to emit light.

Each pixel of such an organic light emitting device may include a light emitting unit and a driving unit. The light emitting unit may include an organic light emitting diode that is a self-light-emitting element, and the driving unit may include a plurality of transistors and at least one capacitor for driving the organic light emitting diode. The plurality of transistors may include a switching transistor and a driving transistor. The organic light emitting diode may be disposed on the transistor.

The driving unit of each pixel receives a predetermined data voltage from a data line, and accordingly the light emitting unit may represent a predetermined luminance.

SUMMARY

When pixels representing different colors are connected to one data line, there is a problem that power consumption increases compared to when the pixels representing the same color are connected to one data line. In addition, in order to reduce the power consumption, there is a problem of lowering the resolution when disposing the pixels representing the same color along the data line.

Exemplary embodiments are to provide a display device capable of realizing high resolution with low power consumption.

A display device according to an exemplary embodiment includes: a plurality of scan lines extending in a first direction; a plurality of first data lines, a plurality of second data lines, and a plurality of third data lines which extend in a second direction crossing the first direction; a first driving unit connected to the scan lines and the first data lines; a first light emitting unit connected to the first driving unit; a second driving unit connected to the scan lines and the second data lines; a second light emitting unit connected to the second driving unit; a third driving unit connected to the scan lines and the second data lines; and a third light emitting unit connected to the third driving unit. The first light emitting unit overlaps the second driving unit or the third driving unit, the second light emitting unit overlaps the first driving unit or the third driving unit, and the third light emitting unit overlaps the first driving unit or the second driving unit in a plan view.

The first light emitting unit may overlap the second driving unit, the second light emitting unit may overlap the first driving unit or the third driving unit, and the third light emitting unit overlaps the second driving unit.

The first light emitting unit may emit red light, the second light emitting unit may emit green light, and the third light emitting unit may emit blue light.

The first driving unit may not be connected to the second data line and the third data line, the second driving unit may not be connected to the first data line and the third data line, and the third driving unit may not be connected to the first data line and the second data line.

The first to third light emitting units may each be provided in plural. The display device according to an exemplary embodiment may further include: a first light emission group including the first light emitting unit, the second light emitting unit, the third light emitting unit, and the second light emitting unit sequentially disposed along a positive first direction; and a second light emission group including the third light emitting unit, the second light emitting unit, the first light emitting unit, and the second light emitting unit sequentially disposed along the positive first direction, and the first light emission group and the second light emission group may be disposed to be adjacent in the second direction.

The first light emitting unit of the first light emission group may be adjacent to the third light emitting unit of the second light emission group in the second direction, the second light emitting unit of the first light emission group may be adjacent to the second light emitting unit of the second light emission group in the second direction, and the third light emitting unit of the first light emission group may be adjacent to the first light emitting unit of the second light emission group in the second direction.

The first light emitting unit of the first light emission group may be connected to the first driving unit positioned at the positive first direction from (i.e., the right of) the first light emitting unit of the first light emission group, and the second light emitting unit of the first light emission group may be connected to the second driving unit positioned at a negative first direction from (i.e., the left of) the second light emitting unit of the first light emission group.

The first data line may be positioned between the first light emitting unit and the first driving unit of the first light emission group, and the first driving unit may be connected to the first data line.

The first data line may be disposed between the first light emitting unit of the first light emission group and the second light emitting unit of the first light emission group.

The first light emitting unit of the second light emission group may be connected to the first driving unit positioned at the negative first direction the first light emitting unit of the second light emission group, and the second light emitting unit of the second light emission group may be connected to the second driving unit positioned at the positive first direction the second light emitting unit of the second light emission group.

The second data line may be disposed between the second light emitting unit and the second driving unit of the second light emission group, and the second driving unit may be connected to the second data line.

The second data line may be disposed between the first light emitting unit of the second light emission group and the second light emitting unit of the second light emission group.

The first light emitting unit of the first light emission group may be connected to the first driving unit adjacent to the first light emitting unit of the first light emission group in a third direction which is a diagonal direction between the first and second directions and forming an acute angle with respect to the first direction, the second light emitting unit of the first light emission group may be connected to the second driving unit adjacent to the second light emitting unit of the first light emission group in the third direction, and the third light emitting unit of the first light emission group may be connected to the third driving unit adjacent to the third light emitting unit of the first light emission group in the third direction.

The first light emitting unit of the second light emission group may be connected to the first driving unit of the first light emission group and adjacent to the first light emitting unit of the second light emission group in a fourth direction which is a diagonal direction forming an obtuse angle with respect to the first direction, the second light emitting unit of the second light emission group may be connected to the second driving unit of the first light emission group and adjacent to the second light emitting unit of the second light emission group in the fourth direction, and the third light emitting unit of the second light emission group may be connected to the third driving unit of the first light emission group and adjacent to the third light emitting unit of the second light emission group in the fourth direction.

A display device according to an exemplary embodiment includes: a first light emitting unit which displays a first color; a first driving unit which drives the first light emitting unit; a second light emitting unit which displays a second color; a second driving unit which drives a second light emitting unit; and a first data line disposed between the first driving unit and the second driving unit and connected to the first driving unit. The first data line is disposed between the first light emitting unit and the second light emitting unit, the first light emitting unit overlaps the second driving unit, and the second light emitting unit overlaps the first driving unit in a plan view.

The display device may further include a third light emitting unit which displays a third color; a third driving unit which drives the third light emitting unit; a second data line connected to the second driving unit; and a third data line connected to the third driving unit. The first to third data lines may be provided in plural, and the second data line, the first data line, the second data line, and the third data line may be sequentially and repeatedly disposed.

The second data line may be disposed between the second driving unit and the first driving unit or between the second driving unit and the third driving unit, and the third data line may be disposed between the second driving unit and the third driving unit.

The second light emitting unit may overlap the third driving unit, and the third light emitting unit may overlap the second driving unit in the plan view.

A display device according to an exemplary embodiment includes: a plurality of first light emitting units which display a first color; a plurality of first driving unit which drive the first light emitting units; a plurality of second light emitting units which display a second color; a plurality of second driving unit which drive the second light emitting units; and a first data line disposed between the first driving unit and the second driving unit, connected to the first driving unit, and extending in a first direction. The plurality of first driving units is disposed along the first direction, the plurality of second driving units is disposed along the first direction, and the first light emitting unit is connected to the first driving unit and overlaps the second driving unit adjacent to the first driving unit in a second direction that is a diagonal direction with respect to the first direction in a plan view.

The display device according to an exemplary embodiment may further include: a third light emitting unit which displays a third color; a third driving unit which drives the third light emitting unit; a second data line connected to the second driving unit; and a third data line connected to the third driving unit, and the third light emitting unit is connected to the third driving unit and overlaps the second driving unit adjacent to the third driving unit in the second direction in the plan view.

According to exemplary embodiments, a high-resolution display device may be implemented with low power consumption.

DETAILED DESCRIPTION

Figure 1:
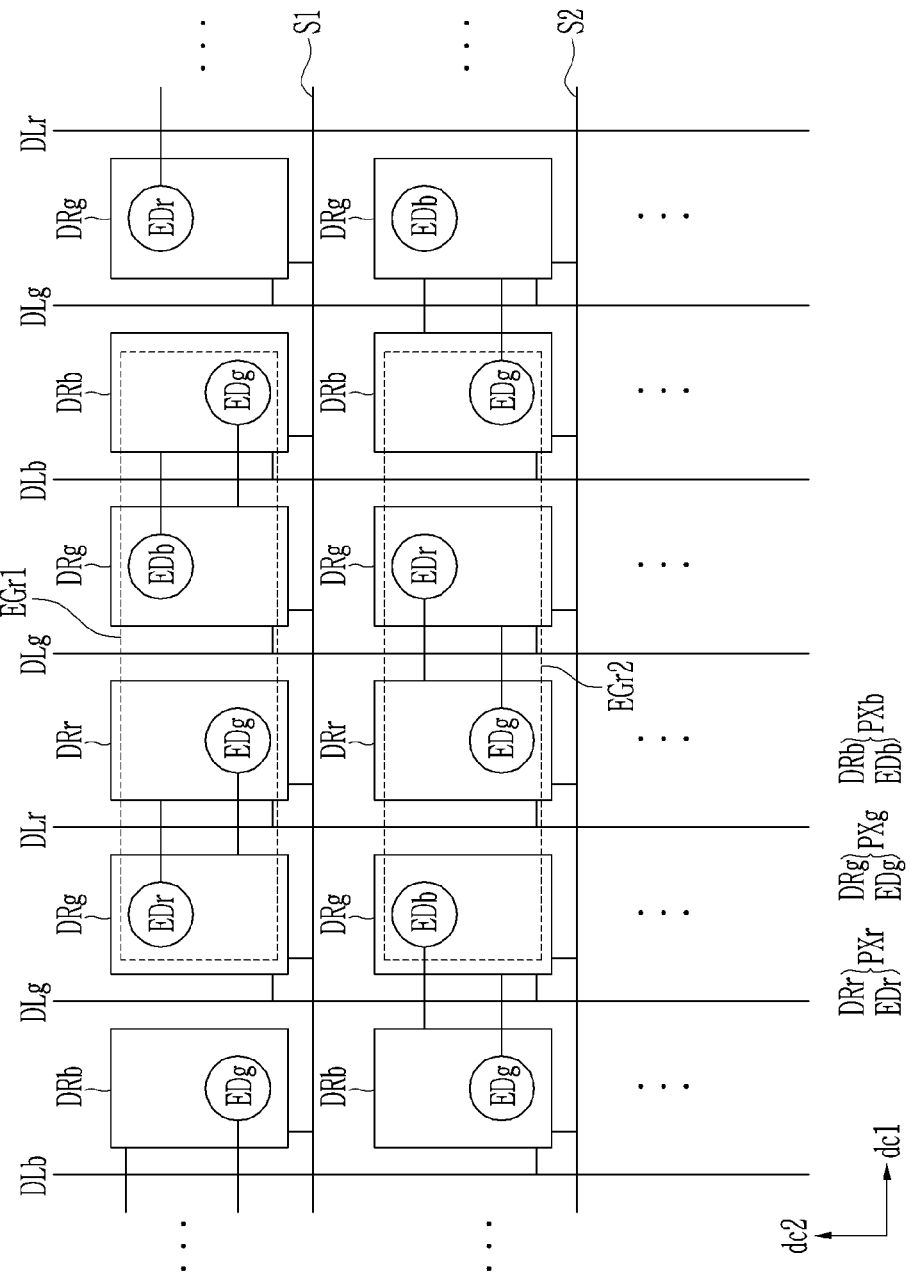
FIG. 1 is a plan view showing a display device according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Descriptions of parts not related to the present invention are omitted, and like reference numerals designate like elements throughout the specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Further, since sizes and thicknesses of constituent members shown in the accompanying drawings are arbitrarily given for better understanding and ease of description, the present invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "in a plan view" means viewing a target portion from the top, and the phrase "in a cross-sectional view" means viewing a cross-section formed by vertically cutting a target portion from the side.

Now, a display device according to an exemplary embodiment is described with reference to FIG. 1.

FIG. 1 is a plan view showing a display device according to an exemplary embodiment.

As shown in FIG. 1, a display device according to an exemplary embodiment includes a plurality of pixels PXr, PXg, and PXb. A plurality of pixels PXr, PXg, and PXb may include a first color pixel PXr, a second color pixel PXg, and a third color pixel PXb. The first color pixel PXr, the second color pixel PXg, and the third color pixel PXb may represent different colors. For example, the first color pixel PXr may display red, the second color pixel PXg may display green, and the third color pixel PXb may display blue. However, this is only an example, and the colors displayed by the first color pixel PXr, the second color pixel PXg, and the third color pixel PXb may be variously changed.

The pixels PXr, PXg, and PXb include driving units DRr, DRg, and DRb and light emitting units EDr, EDg, and EDb, respectively. The driving unit DRr, DRg, and DRb may include a plurality of transistors and at least one capacitor for driving the light emitting units EDr, EDg, and EDb. The light emitting units EDr, EDg, and EDb each may include a light emitting diode ("LED") and may emit light by receiving a predetermined signal from the driving unit DRr, DRg, and DRb.

The first color pixel PXr may include a first driving unit DRr and a first light emitting unit EDr, the second color pixel PXg may include a second driving unit DRg and a second light emitting unit EDg, and the third color pixel PXb may include a third driving unit DRb and a third light emitting unit EDb.

The first driving unit DRr of the first color pixel PXr may not overlap the first light emitting unit EDr in a plan view. The first light emitting unit EDr may overlap the second driving unit DRg. Rather, the second driving unit DRg of the second color pixel PXg may not overlap the second light emitting unit EDg in the plan view. Rather, the second light emitting unit EDg may overlap the first driving unit DRr or the third driving unit DRb. The third driving unit DRb of the third color pixel PXb may not overlap the third light emitting unit EDb in the plan view. Rather, the third light emitting unit EDb may overlap the second light emitting unit EDg.

The display device according to an exemplary embodiment may include a plurality of wirings S1, S2, DLr, DLg, and DLb, and a plurality of pixels PXr, PXg, and PXb may be connected to the wirings S1, S2, DLr, DLg, and DLb. The driving unit DRr, DRg, and DRb of a plurality of pixels PXr, PXg, and PXb may be connected to the wirings S1, S2, DLr, DLg, and DLb.

A plurality of wirings S1, S2, DLr, DLg, and DLb include scan lines S1 and S2 and data lines DLr, DLg, and DLb.

The scan lines S1 and S2 may include a first scan line S1 and a second scan line S2. A plurality of scan lines S1 and S2 may extend in the first direction Dc1 and may be disposed to be adjacent to each other in the second direction Dc2. The first direction Dc1 and the second direction Dc2 are in different directions and may cross each other. For example, the first direction Dc1 may be a row direction, and the second direction Dc2 may be a column direction. Although only two scan lines S1 and S2 are shown in FIG. 1, the number of scan lines according to the invention is not limited thereto, and the number of scan lines S1 and S2 may be variously changed according to the resolution of the display device according to an exemplary embodiment.

A plurality of pixels PXr, PXg, and PXb may be disposed along the first direction Dc1 and the second direction Dc2. The pixels PXr, PXg, and PXb disposed in the first pixel row may be connected to the first scan line S1, and the pixels PXr, PXg, and PXb disposed in the second pixel row may be connected to the second scan line S2. As used herein, the "pixel row" refers to a group of pixels disposed in the same row, and the "pixel column" refers to a group of pixels disposed in the same column. The scan signal may be sequentially applied to the first scan line S1 and the second scan line S2, thereby the pixels PXr, PXg, and PXb disposed in the first pixel row and the pixels PXr, PXg, and PXb disposed in the second pixel row may be sequentially emitted.

The data lines DLr, DLg, and DLb may include a first data line DLr, a second data line DLg, and a third data line DLb. A plurality of data lines DLr, DLg, and DLb may extend in the second direction Dc2 and be disposed to be adjacent to each other in the first direction Dc1. FIG. 1 shows only seven data lines DLr, DLg, and DLb, but the number of the data lines according to the invention is not limited thereto, and the number of data lines DLr, DLg, and DLb may be variously changed according to the resolution of the display device according to an exemplary embodiment.

The first data line DLr is connected to the first driving unit DRr of the first color pixel PXr and is not connected to the second color pixel PXg and the third color pixel PXb. The first data line DLr may transmit the first data voltage to the first color pixel PXr, and the first data voltage is a data voltage to display the first color. The second data line DLg is connected to the second driving unit DRg of the second color pixel PXg and is not connected to the first color pixel PXr and the third color pixel PXb. The second data line DLg may transmit the second data voltage to the second color pixel PXg, and the second data voltage is a data voltage to display the second color. The third data line DLb is connected to the third driving unit DRb of the third color pixel PXb and is not connected to the first color pixel PXr and the second color pixel PXg. The third data line DLb may transmit the third data voltage, and the third data voltage is a data voltage to display the third color.

The first data line DLr, the second data line DLg, and the third data line DLb may be repeatedly disposed with a predetermined rule (i.e., order). For example, the third data line DLb may be disposed in the first pixel column, the second data line DLg may be disposed in the second pixel column, the first data line DLr may be disposed in the third pixel column, and the second data line DLg may be disposed in the fourth pixel column. The third data line DLb may be disposed in the fifth pixel column, the second data line DLg may be disposed in the sixth pixel column, and the second data line DLg may be disposed in the seventh pixel column.

That is, the second data line DLg, the first data line DLr, the second data line DLg, and the third data line DLb may be repeatedly disposed.

In this case, the first data line DLr may be positioned between the first driving unit DRr and the second driving unit DRg. The first data line DLr may be positioned between the first light emitting unit EDr and the second light emitting unit EDg. The second data line DLg may be positioned between the first driving unit DRr and the second driving unit DRg or between the second driving unit DRg and the third driving unit DRb. The second data line DLg may be positioned between the first light emitting unit EDr and the second light emitting unit EDg or between the second light emitting unit EDg and the third light emitting unit EDb. The third data line DLb may be positioned between the second driving unit DRg and the third driving unit DRb. The third data line DLb may be dB positioned between the second light emitting unit EDg and the third light emitting unit EDb.

In the display device according to an exemplary embodiment, the data lines DLr, DLg, and DLb are connected to the pixels PXr, PXg, and PXb, respectively. That is, the data line DLr is connected only to pixels PXr which display the same color, not to PXg and PXb. The data line DLg is connected only to pixels PXg which display the same color, not to PXr and PXb. The data line DLb is connected only to pixels PXb which display the same color, not to PXg and PXr. One data line DLr, DLg, and DLb is not connected to the pixels PXr, PXg, and PXb displaying different colors. For example, in a screen displaying the first color entirely, the same first data voltage may be applied to the first data line DLr, the same second data voltage may be applied to the second data line DLg, and the same third data voltage may be applied to the third data line DLb. Unlike the display device according to the exemplary embodiment above, if one data line is connected to the pixels PXr, PXg, and PXb displaying different colors together, the different first data voltage and third data voltage should be applied alternately to the first data line DLr. At this time, as the difference between the first data voltage and the third data voltage is large, power consumption may increase. However, in the display device according to an exemplary embodiment, since the data lines DLr, DLg, and DLb each are connected to the pixels displaying the same color, the power consumption may be reduced. This may reduce the power consumption by the same principle, as there are many cases of having similar colors for each region not only when displaying any one color on the entire screen but also when displaying a general image.

Hereinafter, the connection relationship of the driving units DRr, DRg, and DRb and the light emitting units EDr, EDg, and EDb is described as follows. In one pixel, the driving unit DRr, DRg, and DRb and the light emitting unit EDr, EDg, and EDb connected thereto are not overlapped with each other in a plan view. The driving unit DRr, DRg, and DRb overlap other light emitting unit EDr, EDg, and EDb that is not connected thereto.

First, referring to the first pixel row, the third driving unit DRb, the second driving unit DRg, the first driving unit DRr, the second driving unit DRg, the third driving unit DRb, and the first driving unit DRr are sequentially disposed. The second light emitting unit EDg connected to the second driving unit DRg positioned in the second pixel column may overlap the first driving unit DRr positioned in the third pixel column. The first light emitting unit EDr connected to the first driving unit DRr positioned on the third pixel column may overlap the second driving unit DRg positioned on the second pixel column in the plan view. The second light emitting unit EDg connected to the second driving unit DRg positioned in the fourth pixel column may overlap the third driving unit DRb positioned in the fifth pixel column. The third light emitting unit EDb connected to the third driving unit DRb positioned in the fifth pixel column can overlap the second driving unit DRg positioned in the fourth pixel column.

Next, referring to the second pixel row, the third driving unit DRb, the second driving unit DRg, the first driving unit DRr, the second driving unit DRg, the third driving unit DRb, and the first driving unit DRr are sequentially disposed. The third light emitting unit EDb connected to the third driving unit DRb positioned in the first pixel column may overlap the second driving unit DRg positioned in the second pixel column. The second light emitting unit EDg connected to the second driving unit DRg positioned in the second pixel column may overlap the third driving unit DRb positioned in the first pixel column. The first light emitting unit EDr connected to the first driving unit DRr positioned in the third pixel column may overlap the second driving unit DRg positioned in the fourth pixel column. The second light emitting unit EDg connected to the second driving unit DRg positioned in the fourth pixel column may overlap the first driving unit DRr positioned in the third pixel column. The third light emitting unit EDb connected to the third driving unit DRb positioned in the fifth pixel column may overlap the second driving unit DRg positioned in the sixth pixel column. The second light emitting unit EDg connected to the second driving unit DRg positioned in the sixth pixel column may overlap the third driving unit DRb positioned in the fifth pixel column.

Thus, the first light emitting unit EDr may overlap the second driving unit DRg, the second light emitting unit EDg may overlap the first driving unit DRr or the third driving unit DRb, and the third light emitting unit EDb may overlap the second driving unit DRg. However, the present invention is not limited thereto, and the first light emitting unit EDr may overlap the second driving unit DRg or the third driving unit DRb in another embodiment. In addition, the third light emitting unit EDb may overlap the first driving unit DRr or the second driving unit DRg.

The arrangement shape of the light emitting unit EDr, EDg, and EDb according to the connection relationship between the driving unit DRr, DRg and DRb and the light emitting units EDr, EDg, and EDb as described above is described as follows.

The light emitting units EDr, EDg, and EDb may be grouped into a predetermined group. The display device according to an exemplary embodiment may include a first light emission group EGr1 and a second light emission group EGr2.

The first light emission group EGr1 may include one first light emitting unit EDr, two second light emitting units EDg, and one third light emitting unit EDb. The first light emission group EGr1 may include the first light emitting unit EDr, the second light emitting unit EDg, the third light emitting unit EDb, and the second light emitting unit EDg that are sequentially disposed in the first direction Dc1. In the first pixel row, the first light emission group EGr1 may be repeatedly disposed.

In the first light emission group EGr1, the first light emitting unit EDr may be connected to the first driving unit DRr positioned to the right (i.e., positive first direction) of the first light emitting unit EDr. In the first light emission group EGr1, the second light emitting unit EDg may be connected to the second driving unit DRg positioned to the left (i.e., negative first direction) of the second light emitting unit EDg. As used herein, the "positive first direction" is a direction of the arrow (i.e., right direction) of the first direction Dc1 in FIG. 1, and the "negative first direction" is a direction opposite the positive first direction. At this time, the first data line DLr may be positioned between the first light emitting unit EDr and the first driving unit DRr, and the first data line DLr is connected to the first driving unit DRr. In addition, the first data line DLr may be positioned between the first light emitting unit EDr and the second light emitting unit EDg.

In the first light emission group EGr1, the third light emitting unit EDb may be connected to the third driving unit DRb positioned to the right of the third light emitting unit EDb. In the first light emission group EGr1, the second light emitting unit EDg may be connected to the second driving unit DRg positioned to the left of the second light emitting unit EDg. At this time, the third data line DLb may be positioned between the third light emitting unit EDb and the third driving unit DRb, and the third data line DLb is connected to the third driving unit DRb. In addition, the third data line DLb may be positioned between the third light emitting unit EDb and the second light emitting unit EDg.

The second data line DLg connected to the second driving unit DRg in the first light emission group EGr1 may be positioned between the second light emitting unit EDg and the third light emitting unit EDb. In addition, the second data line DLg connected to the second driving unit DRg in the first light emission group EGr1 may be positioned between the first driving unit DRr and the second driving unit DRg.

The second light emission group EGr2 may include one first light emitting unit EDr, two second light emitting units EDg, and one third light emitting unit EDb. The second light emission group EGr2 may include the third light emitting unit EDb, the second light emitting unit EDg, the first light emitting unit EDr, and the second light emitting unit EDg that are sequentially displaced along the first direction Dc1. In the second pixel row, the second light emission group EGr2 may be repeatedly disposed.

In the second light emission group EGr2, the first light emitting unit EDr may be connected to the first driving unit DRr positioned to the left of the first light emitting unit EDr. In the second light emission group EGr2, the second light emitting unit EDg may be connected to the second driving unit DRg positioned to the right of the second light emitting unit EDg. At this time, the second data line DLg may be positioned between the second light emitting unit EDg and the second driving unit DRg, and the second data line DLg is connected to the second driving unit DRg. In addition, the second data line DLg may be positioned between the first light emitting unit EDr and the second light emitting unit EDg.

In the second light emission group EGr2, the third light emitting unit EDb may be connected to the third driving unit DRb positioned to the left of the third light emitting unit EDb. In the second light emission group EGr2, the second light emitting unit EDg may be connected to the second driving unit DRg positioned to the right of the second light emitting unit EDg.

The first data line DLr connected to the first driving unit DRr in the second light emission group EGr2 may be positioned between the second light emitting unit EDg and the third light emitting unit EDb. In addition, the third data line DLb connected to the third driving unit DRb in the second light emission group EGr2 may be positioned between the first driving unit DRr and the second driving unit DRg.

The first light emitting unit EDr of the first light emission group EGr1 may be adjacent to the third light emitting unit EDb of the second light emission group EGr2 in the second direction Dc2. The second light emitting unit EDg of the first light emission group EGr1 may be adjacent to the second light emitting unit EDg of the second light emission group EGr2 in the second direction Dc2. The third light emitting unit EDb of the first light emission group EGr1 may be adjacent to the first light emitting unit EDr of the second light emission group EGr2 in the second direction Dc2. This pixel arrangement structure is called a pentile matrix and shares the adjacent pixels to express the color, thus high resolution may be implemented with a small number of the pixels.

Hereinafter, the cross-sectional shape of the display device according to an exemplary embodiment is further described with reference to FIG. 2 to FIG. 5 along with FIG. 1.

Figure 2:
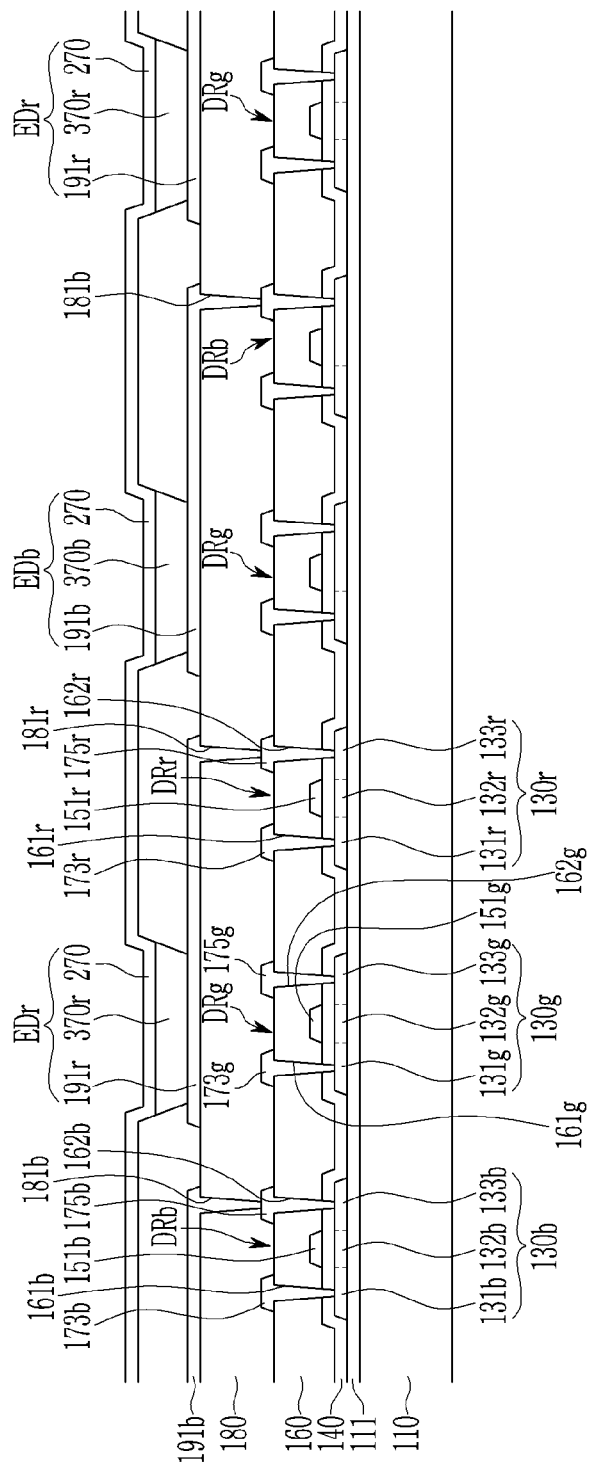
FIG. 2 to FIG. 5 are cross-sectional views showing some regions of a display device according to an exemplary embodiment.
Figure 3:
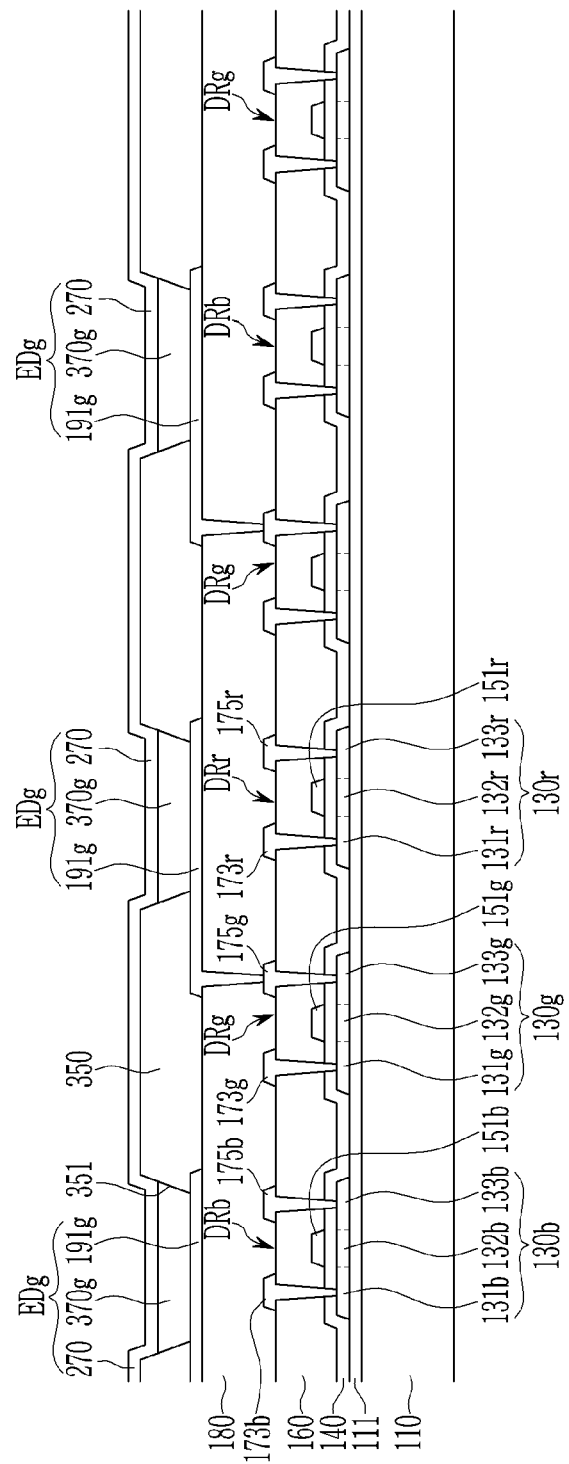
Figure 4:
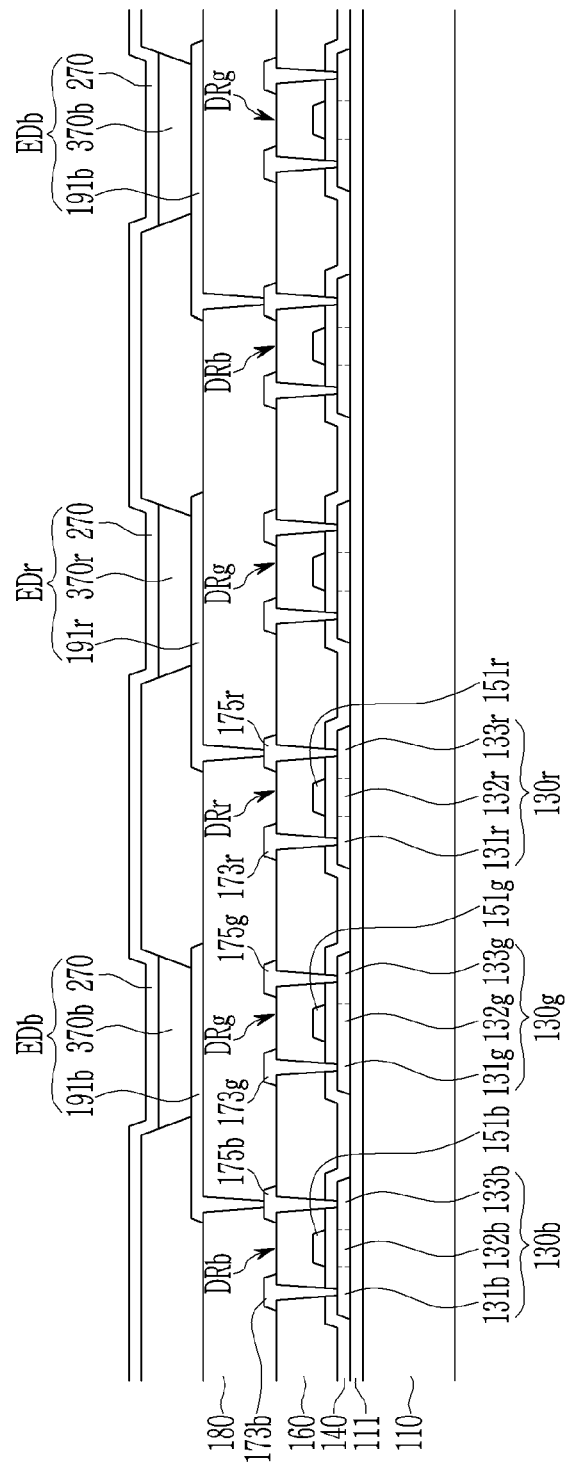
Figure 5:
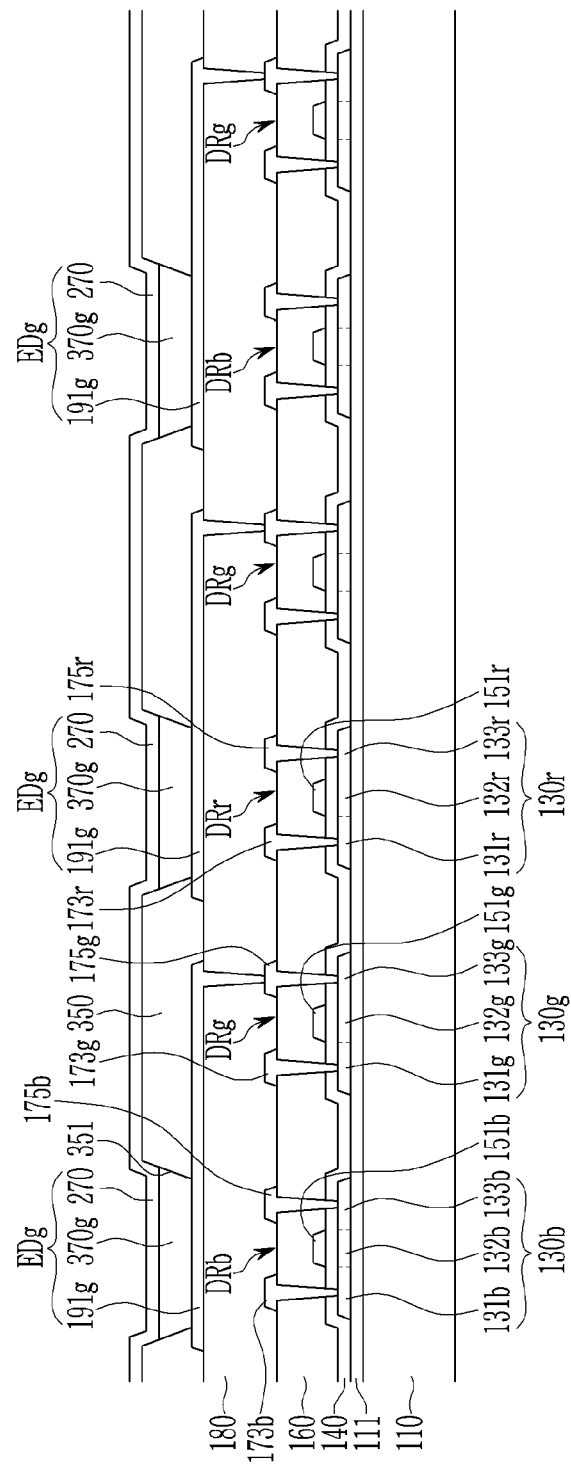

FIG. 2 to FIG. 5 are cross-sectional views showing some regions of a display device according to an exemplary embodiment. FIG. 2 and FIG. 3 represent a plurality of pixels disposed in the first pixel row, and FIG. 4 and FIG. 5 represent a plurality of pixels disposed in the second pixel row.

As shown in FIG. 2 to FIG. 5, a display device according to an exemplary embodiment may include a substrate 110. The substrate 110 may include at least one among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may include a flexible material capable of bending or folding and may be single-layered or multi-layered.

A buffer layer 111 may be disposed on the substrate 110. The buffer layer 111 may have a single-layered or multi-layered structure. The buffer layer 111 may include an inorganic insulating material or an organic insulating material such as a silicon nitride (SiNx), a silicon oxide (SiOx), and a silicon oxynitride (SiOxNy). The buffer layer 111 may be omitted in some cases. In addition, a barrier layer may be further positioned between the substrate 110 and the buffer layer 111. The barrier layer may have a single-layered or multi-layered structure. The barrier layer may include an inorganic insulating material such as a silicon nitride (SiNx), a silicon oxide (SiOx), and a silicon oxynitride (SiOxNy).

In the buffer layer 111, a semiconductor layer including a semiconductor layer 130r of the first driving unit DRr, a semiconductor layer 130g of the second driving unit DRg, and a semiconductor layer 130b of the third driving unit DRb may be disposed. The semiconductor layer 130r of the first driving unit DRr may include a first region 131r, a channel 132r, and a second region 133r. The first region 131r and the second region 133r may be positioned on opposite sides of the channel 132r of the semiconductor layer 130r of the first driving unit DRr, respectively. The semiconductor layer 130g of the second driving unit DRg may include a first region 131g, a channel 132g, and a second region 133g. The first region 131g and the second region 133g may be positioned on opposite sides of the channel 132g of the semiconductor layer 130g of the second driving unit DRg, respectively. The semiconductor layer 130b of the third driving unit DRb may include a first region 131b, a channel 132b, and a second region 133b. The first region 131b and the second region 133b may be positioned on opposite sides of the channel 132b of the semiconductor layer 130b of the third driving unit DRb, respectively. The semiconductor layer 130r of the first driving unit DRr, the semiconductor layer 130g of the second driving unit DRg, and the semiconductor layer 130b of the third driving unit DRb may include a semiconductor material such as amorphous silicon, polysilicon, and an oxide semiconductor.

A gate insulating layer 140 may be positioned on the semiconductor layer 130r of the first driving unit DRr, the semiconductor layer 130g of the second driving unit DRg, and the semiconductor layer 130b of the third driving unit DRb. The gate insulating layer 140 may have a single-layered or multi-layered structure. The gate insulating layer 140 may include inorganic insulating materials such as a silicon nitride (SiNx), a silicon oxide (SiOx), and a silicon oxynitride (SiOxNy).

On the gate insulating layer 140, a gate conductive layer including a gate electrode 151r of the first driving unit DRr, a gate electrode 151g of the second driving unit DRg, and a gate electrode 151b of the third driving unit DRb may be disposed. The gate electrode 151r of the first driving unit DRr may overlap the channel 132r of the semiconductor layer 130r in a plan view. The gate electrode 151g of the second driving unit DRg may overlap the channel 132g of the semiconductor layer 130g. The gate electrode 151b of the third driving unit DRb may overlap the channel 132b of the semiconductor layer 130b. The gate conductive layer may have a single-layered or multi-layered structure. The first gate conductive layer may include a metal material such as molybdenum (Mo), aluminum (Al), copper (Cu), and/or titanium (Ti). After forming the gate conductive layer, a doping process or plasma treatment may be performed. The part of the semiconductor layer that is covered by the gate conductive layer is not doped or plasma-treated, and the part of the semiconductor layer that is not covered by the first gate conductive layer is doped or plasma-treated so that it may have the same characteristic as the conductor.

An interlayer insulating layer 160 is positioned on the gate electrode 151r of the first driving unit DRr, the gate electrode 151g of the second driving unit DRg, and the gate electrode 151b of the third driving unit DRb. The interlayer insulating layer 160 may have a single-layered or multi-layered structure. The interlayer insulating layer 160 may include an inorganic insulating material or organic insulating material.

In the interlayer insulating layer 160, a data conductive layer including a source electrode 173r and a drain electrode 175r of the first driving unit DRr, a source electrode 173g and a drain electrode 175g of the second driving unit DRg, and a source electrode 173b and a drain electrode 175b of the third driving unit DRb may be positioned.

The interlayer insulating layer 160 may include an opening 161r overlapping the source electrode 173r of the first driving unit DRr and the first region 131r of the semiconductor layer 130r in a plan view. The source electrode 173r of the first driving unit DRr may be connected to the first region 131r of the semiconductor layer 130r through the opening 161r. The interlayer insulating layer 160 may include an opening 162r overlapping the drain electrode 175r of the first driving unit DRr and the second region 133r of the semiconductor layer 130r. The drain electrode 175r of the first driving unit DRr may be connected to the second region 133r of the semiconductor layer 130r through the opening 162r.

The interlayer insulating layer 160 may include an opening 161g overlapping the source electrode 173g of the second driving unit DRg and the first region 131g of the semiconductor layer 130g in a plan view. The source electrode 173g of the second driving unit DRg may be connected to the first region 131g of the semiconductor layer 130g through the opening 161g. The interlayer insulating layer 160 may include an opening 162g overlapping the drain electrode 175g of the second driving unit DRg and the second region 133g of the semiconductor layer 130g. The drain electrode 175g of the second driving unit DRg may be connected to the second region 133g of the semiconductor layer 130g through the opening 162g.

The interlayer insulating layer 160 may include an opening 161b overlapping the source electrode 173b of the third driving unit DRb and the first region 131b of the semiconductor layer 130b. The source electrode 173b of the third driving unit DRb may be connected to the first region 131b of the semiconductor layer 130b through the opening 161b. The interlayer insulating layer 160 may include an opening 162b overlapping the drain electrode 175b of the third driving unit DRb and the second region 133b of the semiconductor layer 130b in a plan view. The drain electrode 175b of the third driving unit DRb may be connected to the second region 133b of the semiconductor layer 130b through the opening 162b.

The data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first driving unit DRr may include the semiconductor layer 130r, the gate electrode 151r, the source electrode 173r, and the drain electrode 175r, the second driving unit DRg may include the semiconductor layer 130g, the gate electrode 151g, the source electrode 173g, and the drain electrode 175g, and the third driving unit DRb may include the semiconductor layer 130b, the gate electrode 151b, the source electrode 173b, and the drain electrode 175b.

In the first pixel row and second pixel row, the third driving unit DRb, the second driving unit DRg, the first driving unit DRr, the second driving unit DRg, the third driving unit DRb, and the second driving unit DRg may be sequentially disposed.

A passivation layer 180 may be disposed on the source electrode 173r and the drain electrode 175r of the first driving unit DRr, the source electrode 173g and the drain electrode 175g of the second driving unit DRg, and the source electrode 173b and the drain electrode 175b of the third driving unit DRb.

The passivation layer 180 may include an organic insulating material such as a generally-used polymer such as poly(methylmethacrylate) ("PMMA") or polystyrene ("PS"), a polymer derivative having a phenol-based group, an acryl-based polymer, an imide-based polymer, polyimide, an acryl-based polymer, and a siloxane-based polymer.

A first pixel electrode 191r, a second pixel electrode 191g, and a third pixel electrode 191b may be positioned on the passivation layer 180.

The passivation layer 180 may include an opening 181r overlapping the first pixel electrode 191r and the drain electrode 175r of the first driving unit DRr in a plan view. The first pixel electrode 191r may be connected to the drain electrode 175r of the first driving unit DRr through the opening 181r. The first pixel electrode 191r may overlap the second driving unit DRg. As shown in FIG. 2, in the first pixel row, the first pixel electrode 191r extends to the left, so that it may overlap the second driving unit DRg positioned at the left of the first driving unit DRr. As shown in FIG. 4, in the second pixel row, the first pixel electrode 191r extends to the right, so that it may overlap the second driving unit DRg positioned at the right of the first driving unit DRr.

The passivation layer 180 may include an opening 181g overlapping the second pixel electrode 191g and the drain electrode 175g of the second driving unit DRg. The second pixel electrode 191g may be connected to the drain electrode 175g of the second driving unit DRg through the opening 181g. The second pixel electrode 191g may overlap the first driving unit DRr or the third driving unit DRb. As shown in FIG. 3, in the first pixel row, the second pixel electrode 191g extends to the right, so that it may overlap the first driving unit DRr or the third driving unit DRb positioned to the right of the second driving unit DRg. As shown in FIG. 5, in the second pixel row, the second pixel electrode 191g extends to the left, so that it may overlap the first driving unit DRr or the third driving unit DRb positioned to the left of the second driving unit DRg.

The passivation layer 180 may include an opening 181b overlapping the third pixel electrode 191b and the drain electrode 175b of the third driving unit DRb. The third pixel electrode 191b may be connected to the drain electrode 175b of the third driving unit DRb through the opening 181b. The third pixel electrode 191b may overlap the second driving unit DRg. As shown in FIG. 2, in the first pixel row, the third pixel electrode 191b extends to the left, so that it may overlap the second driving unit DRg positioned at the left of the third driving unit DRb. As shown in FIG. 4, in the fourth pixel row, the third pixel electrode 191b extends to the right, so that it may overlap the second driving unit DRg positioned on the right side of the third driving unit DRb.

A partition wall 350 may be positioned above the first pixel electrode 191r, the second pixel electrode 191g, and the third pixel electrode 191b. The partition wall 350 may have a pixel opening 351, and the pixel opening 351 of the partition wall 350 may overlap the first pixel electrode 191r, the second pixel electrode 191g, and the third pixel electrode 191b.

The first light-emitting element layer 370r, the second light-emitting element layer 370g, and the third light-emitting element layer 370b may be disposed in the pixel opening 351 of the partition wall 350. The first light-emitting element layer 370r may overlap the first pixel electrode 191r. The second light-emitting element layer 370g may overlap the second pixel electrode 191g. The third light-emitting element layer 370b may overlap the third pixel electrode 191b in a plan view.

A common electrode 270 may be positioned on the first light-emitting element layer 370r, the second light-emitting element layer 370g, the third light-emitting element layer 370b, and the partition wall 350. The common electrode 270 may be positioned on the entire substrate 110.

The first pixel electrode 191r, the first light-emitting element layer 370r, and the common electrode 270 may constitute the first light emitting unit EDr. The first light emitting unit EDr refers to a region capable of emitting light by the first pixel electrode 191r, the first light-emitting element layer 370r, and the common electrode 270. The first light emitting unit EDr may overlap the second driving unit DRg and may not overlap the first driving unit DRr.

The second pixel electrode 191g, the second light-emitting element layer 370g, and the common electrode 270 may constitute the second light emitting unit EDg. The second light emitting unit EDg refers to a region capable of emitting light by the second pixel electrode 191g, the second light-emitting element layer 370g, and the common electrode 270. The second light emitting unit EDg may overlap the first driving unit DRr or the third driving unit DRb, and may not overlap the second driving unit DRg.

The third pixel electrode 191b, the second light-emitting element layer 370b, and the common electrode 270 may constitute the third light emitting unit EDb. The third light emitting unit EDb refers to a region capable of emitting light by the third pixel electrode 191b, the third light-emitting element layer 370b, and the common electrode 270. The third light emitting unit EDb may overlap the second driving unit DRg and may not overlap the third driving unit DRb in a plan view.

In the above, one transistor included in the driving units DRr, DRg, and DRb of each pixel PXr, PXg, and PXb has been described, but each driving unit DRr, DRg, and DRb may include a plurality of transistors. In the following, an example of a plurality of transistors included in each driving unit DRr, DRg, and DRb is described with reference to FIG. 6.

Figure 6:
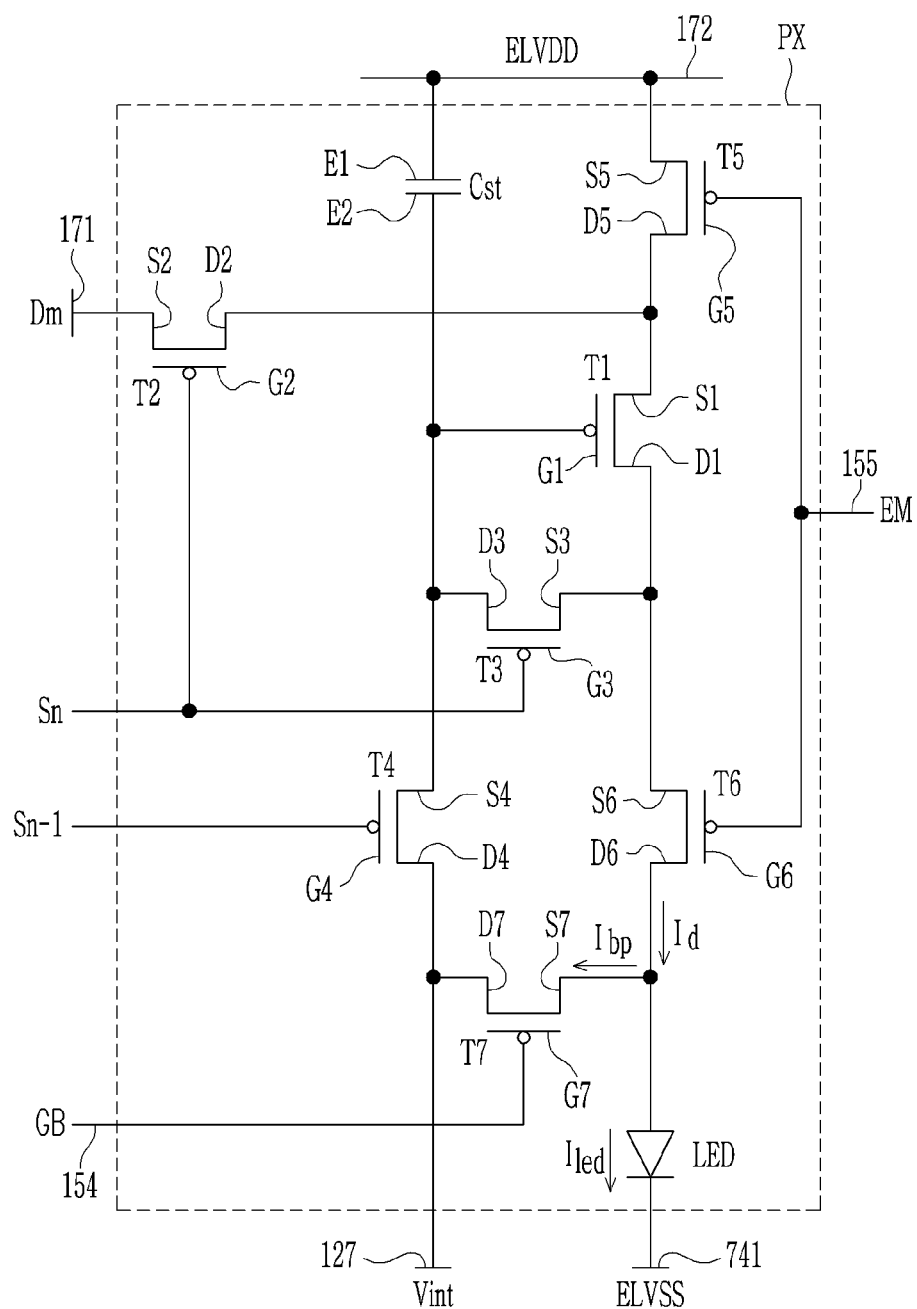
FIG. 6 is a circuit diagram of a display device according to an exemplary embodiment.

FIG. 6 is a circuit diagram of a display device according to an exemplary embodiment.

As shown in FIG. 6, each pixel PXr, PXg, and PXb of the display device according to an exemplary embodiment may include a plurality of transistors T1, T2, T3, T4, T5, T6, and T7, a storage capacitor Cst, and a light emitting diode (LED), which are connected to several signal lines.

A plurality of transistors T1, T2, T3, T4, T5, T6, and T7 include a driving transistor T1, a switching transistor connected to a scan line Sn, that is, a second transistor T2 and a third transistor T3, and other transistors are transistors (hereinafter, a compensation transistor) required for operating the light emitting diode (LED). These compensation transistors T4, T5, T6, and T7 may include a fourth transistor T4, a fifth transistor T5, a sixth transistor T6, and a seventh transistor T7.

A plurality of signal lines may include a scan line Sn, a previous scan line Sn−1, a light emission control line 155, a bypass control line 154, a data line 171, a driving voltage line 172, an initialization voltage line 127, and a common voltage line 741. The bypass control line 154 may be part of the previous scan line Sn−1 or may be electrically connected thereto. Alternatively, the bypass control line 154 may be a part of the scan line Sn or may be electrically connected thereto.

The scan line Sn is connected to the gate driver and transmits the scan signal to the second transistor T2 and the third transistor T3. The previous scan line Sn−1 is connected to the gate driver and transmits the previous scan signal applied to the pixel PX positioned at the previous stage to the fourth transistor T4. The light emission control line 155 is connected to the light emission controller and transmits a light emission control signal that controls a light emission time of the light emitting diode (LED) to the fifth transistor T5 and the sixth transistor T6. The bypass control line 154 transmits the bypass signal to the seventh transistor T7.

The data line 171 is a wire that transmits the data voltage generated by the data driver, and a luminance at which the light emitting diode (LED) emits light varies according to the data voltage. The driving voltage line 172 applies the driving voltage ELVDD. The initialization voltage line 127 transmits an initialization voltage Vint to initialize the driving transistor T1. The common voltage line 741 applies a common voltage ELVSS. The driving voltage line 172, the initialization voltage line 127, and the common voltage line 741 may each be applied with a constant voltage.

Hereinafter, a plurality of transistors is described.

The driving transistor T1 is a transistor that adjusts the magnitude of the output current according to the applied data voltage. The output driving current (Id) is applied to the light emitting diode (LED) to adjust the brightness of the light emitting diode (LED) according to the data voltage. For this purpose, the first electrode S1 of the driving transistor T1 is disposed to receive the driving voltage. The first electrode S1 is connected to the driving voltage line 172 via the fifth transistor T5. Also, the first electrode S1 of the driving transistor T1 is connected to the second electrode D2 of the second transistor T2, so that the data voltage is applied. The second electrode D1 (an output electrode) of the driving transistor T1 is disposed to output the current toward the light emitting diode (LED). The second electrode D1 of the driving transistor T1 is connected to the anode of the light emitting diode (LED) via the sixth transistor T6. The gate electrode G1 is connected to one electrode (a second storage electrode E2) of the storage capacitor Cst. Therefore, the voltage of the gate electrode G1 changes according to the voltage stored in the storage capacitor Cst, and the driving current Id output by the driving transistor T1 changes accordingly.

The second transistor T2 is a transistor that accepts the data voltage into the pixel PX. The gate electrode G2 is connected to the scan line Sn, and the first electrode S2 is connected to the data line 171. The second electrode D2 of the second transistor T2 is connected to the first electrode S1 of the driving transistor T1. When the second transistor T2 is turned on according to the scan signal transmitted through the scan line Sn, the data voltage transmitted through the data line 171 is transmitted to the first electrode S1 of the driving transistor T1.

The third transistor T3 is a transistor that allows a compensation voltage that the data voltage changed through the driving transistor T1 to be transferred to the second storage electrode E2 of the storage capacitor Cst. The gate electrode G3 is connected to the scan line Sn, and the first electrode S3 is connected to the second electrode D1 of the driving transistor T1. The second electrode D3 of the third transistor T3 is connected to the second storage electrode E2 of the storage capacitor Cst and the gate electrode G1 of the driving transistor T1. When the third transistor T3 is turned on according to the scan signal received through the scan line Sn, the gate electrode G1 and the second electrode D1 of the driving transistor T1 are connected and the second electrode D1 of the driving transistor T1 and the second storage electrode E2 of the storage capacitor Cst are also connected.

The fourth transistor T4 serves to initialize the gate electrode G1 of the driving transistor T1 and the second storage electrode E2 of the storage capacitor Cst. The gate electrode G4 is connected to the previous scan line Sn−1, and the first electrode D4 is connected to the initialization voltage line 127. The second electrode S4 of the fourth transistor T4 is connected to the second storage electrode E2 of the storage capacitor Cst and the gate electrode G1 of the driving transistor T1 via the second electrode D3 of the third transistor T3. The fourth transistor T4 transfers the initialization voltage Vint to the gate electrode G1 of the driving transistor T1 and the second storage electrode E2 of the storage capacitor Cst according to the previous scan signal received through the previous scan line Sn−1. Accordingly, the gate voltage of the gate electrode G1 of the driving transistor T1 and the storage capacitor Cst are initialized. The initialization voltage Vint may have a low voltage value and may be a voltage capable of turning on the driving transistor T1.

The fifth transistor T5 serves to transmit the driving voltage ELVDD to the driving transistor T1. The gate electrode G5 is connected to the light emission control line 155, and the first electrode S5 is connected to the driving voltage line 172. The second electrode D5 of the fifth transistor T5 is connected to the first electrode S1 of the driving transistor T1.

The sixth transistor T6 serves to transmit the driving current Id output from the driving transistor T1 to the light emitting diode (LED). The gate electrode G6 is connected to the light emission control line 155, and the first electrode S6 is connected to the second electrode D1 of the driving transistor T1. The second electrode D6 of the sixth transistor T6 is connected to the anode of the light emitting diode (LED).

The fifth transistor T5 and the sixth transistor T6 are turned on simultaneously according to the light emission control signal transmitted through the light emission control line 155, and when the driving voltage ELVDD is applied to the first electrode S1 of the driving transistor TI through the fifth transistor T5, the driving transistor T1 outputs the driving current Id according to the voltage (i.e., the voltage of the second storage electrode E2 of the storage capacitor Cst) of the gate electrode G1 of the driving transistor TI. The output driving current Id is transmitted to the light emitting diode (LED) through the sixth transistor T6. As the current $I_{led}$ flows through the light emitting diode (LED), the light emitting diode (LED) emits light. A bypass current Ibp which amounts to the difference between the output driving current Id and the current $I_{led}$ flows to the seventh transistor T7.

The seventh transistor T7 serves to initialize the anode of the light emitting diode (LED). The gate electrode G7 is connected to the bypass control line 154, the first electrode S7 is connected to the anode of the light emitting diode (LED), and the second electrode D7 is connected to the initialization voltage line 127. The bypass control line 154 may be connected to the previous scan line Sn−1, and the bypass signal is applied with the same timing signal as the previous scan signal. The bypass control line 154 may not be connected to the previous scan line Sn−1, and may transmit a separate signal from the previous scan signal. When the seventh transistor T7 is turned on according to the bypass signal GB, the initialization voltage Vint is applied to the anode of the light emitting diode (LED) to be initialized The first storage electrode E1 of the storage capacitor Cst is connected to the driving voltage line 172, the second storage electrode E2 is connected to the gate electrode G1 of the driving transistor T1, and the second electrode D3 of the third transistor T3 and the second electrode D4 of the fourth transistor T4 are connected. As a result, the second storage electrode E2 determines the voltage of the gate electrode G1 of the driving transistor T1, and the data voltage is applied through the second electrode D3 of the third transistor T3, or the initialization voltage Vint is applied through the second electrode D4 of the fourth transistor T4.

The anode of the light emitting diode (LED) is connected to the second electrode D6 of the sixth transistor T6 and the first electrode S7 of the seventh transistor T7, and the cathode is connected to the common voltage line 741 that transmits the common voltage ELVSS. That is, the transistor of the driving unit shown in FIG. 2 to FIG. 5 may be the sixth transistor T6.

In the above, it has been described that one pixel includes seven transistors T1 to T7 and one storage capacitor Cst, but the invention is not limited thereto, and the number of transistors, the number of capacitors, and their connection relationship may be variously changed.

Hereinafter a display device according to a comparative example and a display device according to an exemplary embodiment are compared with reference to FIG. 7 and FIG. 8.

Figure 7:
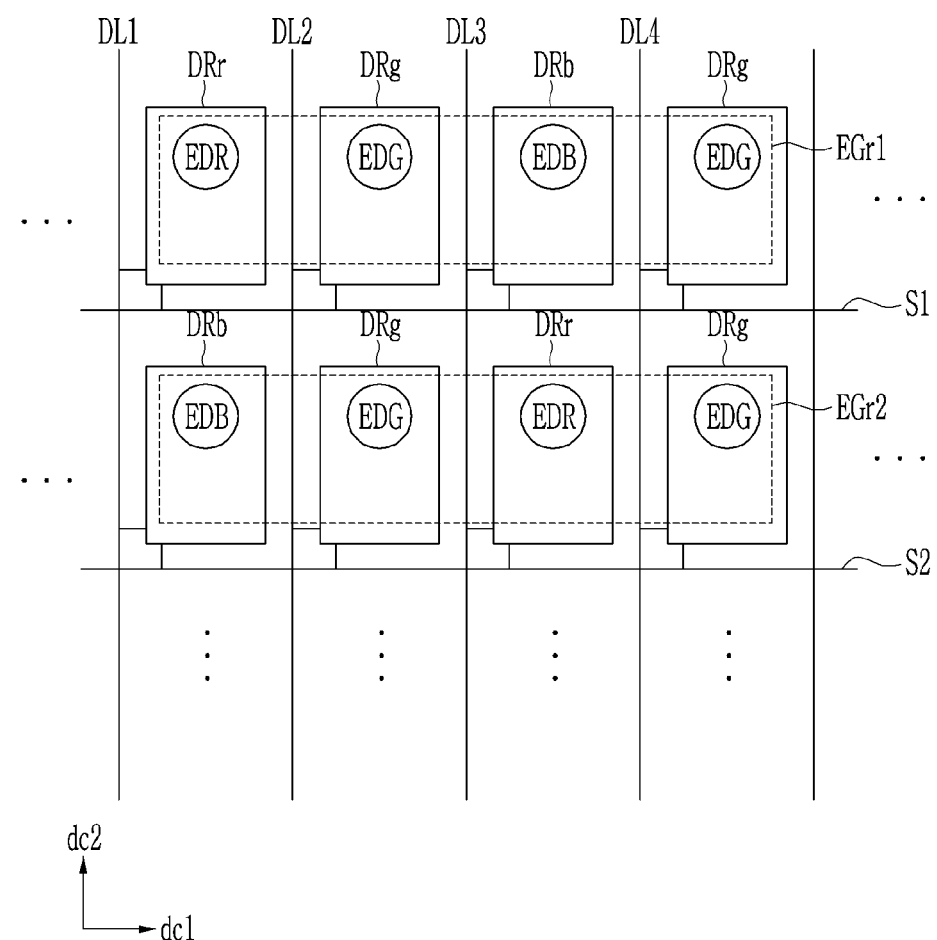
FIG. 7 is a view showing a display device according to a comparative example.
Figure 8:
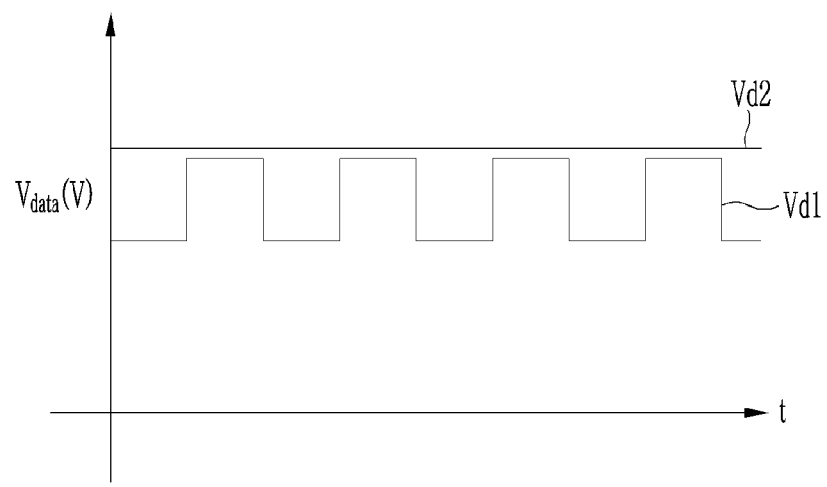
FIG. 8 is a waveform diagram showing a data voltage applied to a display device according to a comparative example.

FIG. 7 is a view showing a display device according to a comparative example, and FIG. 8 is a waveform diagram showing a data voltage applied to a display device according to a comparative example.

As shown in FIG. 7, a display device according to a comparative example includes a plurality of pixels PXr, PXg, and PXb, and each pixel PXr, PXg, and PXb includes a driving unit DRr, DRg, and DRb and a light emitting unit EDr, EDg, and EDb. Also, the display device according to the comparative example may include a plurality of wirings S1, S2, DL1, DL2, and DL3, and a plurality of pixels PXr, PXg, and PXb may be connected to the wirings S1, S2, DL1, DL2, and DL3. A plurality of wirings S1, S2, DL1, DL2, and DL3 include scan lines S1 and S2 and data lines DL1, DL2, and DL3.

The data lines DL1, DL2, and DL3 may include a first data line DL1, a second data line DL2, and a third data line DL3. The first data line DL1 may be alternately connected to the first color pixel PXr and the third color pixel PXb. The second data line DL2 may be connected to the second color pixel PXg. The third data line DL3 may be alternately connected to the third color pixel PXb and the first color pixel PXr. The fourth data line DL4 may be connected to the second color pixel PXg.

The display device according to the comparative example may include a first light emission group EGr1 and a second light emission group EGr2. The first light emission group EGr1 may include a first light emitting unit EDr, a second light emitting unit EDg, a third light emitting unit EDb, and a second light emitting unit EDg that are sequentially disposed along the first direction Dc1. The second light emission group EGr2 may include a third light emitting unit EDb, a second light emitting unit EDg, a first light emitting unit EDr, and a second light emitting unit EDg that are sequentially displaced along the first direction Dc1.

In the display device according to the comparative example, the driving units DRr, DRg, and DRb and the light emitting units EDr, EDg, and EDb connected to the driving units may overlap each other within one pixel. That is, the first light emitting unit EDr may overlap the first driving unit DRr, the second light emitting unit EDg may overlap the second driving unit DRg, and the third light emitting unit EDb may overlap the third driving unit DRb in a plan view.

In the display device according to the comparative example, the first data line DL1 is connected to the first color pixel PXr and the third color pixel PXb displaying different colors. In addition, the third data line DL3 is connected to the third color pixel PXb and the first color pixel PXr that display different colors. Therefore, as shown in FIG. 8, the first data voltage Vd1 applied to the first data line DL1 may be made of voltages having a large difference. Since the second data line DL2 is connected to the second color pixel PXg, the second data voltage Vd2 applied to the second data line DL2 may have a comparatively constant voltage. For example, on a screen displaying only the first color, as shown in FIG. 8, the first data voltage Vd1 may be made of a form in which a high voltage and a low voltage are swung, and the second data voltage Vd2 may be made a constant high voltage. In the case of the third data line DL3, a data voltage of the similar form to that of the first data line DL1 may be applied.

In the display device according to the comparative example, power consumption may increase when being driven to apply this type of the data voltage. In the display device according to an exemplary embodiment, since the data lines DLr, DLg, and DLb each are connected to the pixels displaying the same color, the power consumption may be reduced. The high resolution may be realized by disposing the pixels in the form of a pentile matrix while having this connection structure between the data lines and the pixels. That is, in the display device according to an exemplary embodiment, the high-resolution display device may be implemented without an increase in the power consumption.

Next, the display device according to another exemplary embodiment is described with reference to FIG. 9.

Figure 9:
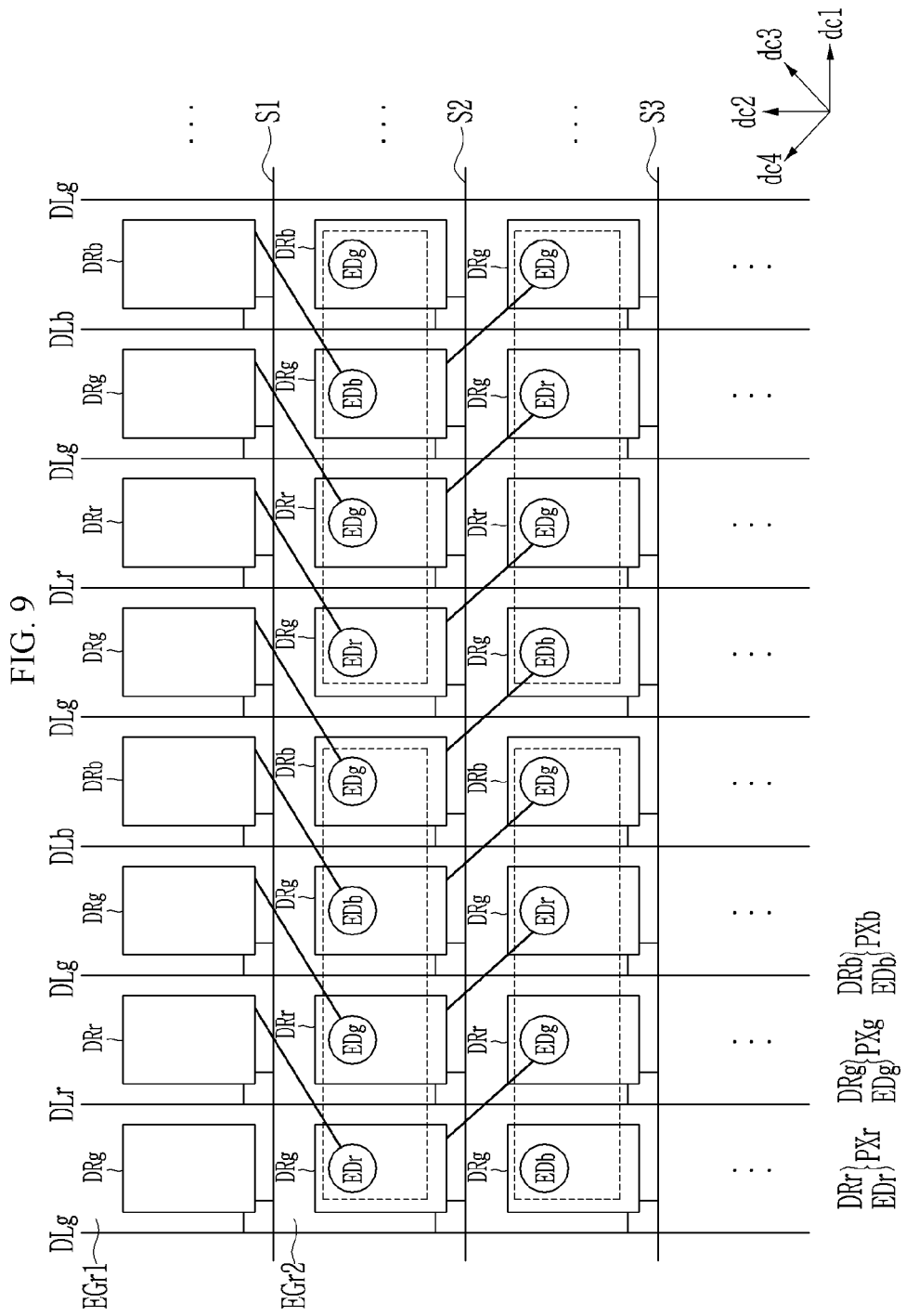
FIG. 9 is a plan view showing a display device according to another exemplary embodiment.

The display device according to the exemplary embodiment shown in FIG. 9 is the same as most of the display device according to the exemplary embodiment shown in FIG. 1 to FIG. 5 so that a description of the same parts is omitted. The present exemplary embodiment is different from the previous exemplary embodiment in that the light emitting unit and the driving unit are connected to each other in a diagonal direction, and is further described below.

FIG. 9 is a plan view showing a display device according to another exemplary embodiment.

The display device according to the exemplary embodiment includes a plurality of pixels PXr, PXg, and PXb. A plurality of pixels PXr, PXg, and PXb may include a first color pixel PXr, a second color pixel PXg, and a third color pixel PXb. Each pixel PXr, PXg, and PXb includes the driving units DRr, DRg, and DRb and the light emitting units EDr, EDg, and EDb, respectively.

The first driving unit DRr of the first color pixel PXr may not overlap the first light emitting unit EDr in a plan view. Rather, the first light emitting unit EDr may overlap the second driving unit DRg. The second driving unit DRg of the second color pixel PXg may not overlap the second light emitting unit EDg in the plan view. Rather, the second light emitting unit EDg may overlap the first driving unit DRr or the third driving unit DRb. The third driving unit DRb of the third color pixel PXb may not overlap the third light emitting unit EDb in the plan view. Rather, the third light emitting unit EDb may overlap the second light emitting unit EDg.

The driving units DRr, DRg, and DRb of a plurality of pixels PXr, PXg, and PXb may be connected to the wirings S1, S2, S3, DLr, DLg, and DLb. A plurality of wirings S1, S2, S3, DLr, DLg, and DLb include the scan lines S1, S2 and S3 and the data lines DLr, DLg, and DLb. The data lines DLr, DLg, and DLb may include a first data line DLr, a second data line DLg, and a third data line DLb. The first data line DLr is connected to the first driving unit DRr of the first color pixel PXr and is not connected to the second color pixel PXg and the third color pixel PXb. The second data line DLg is connected to the second driving unit DRg of the second color pixel PXg and is not connected to the first color pixel PXr and the third color pixel PXb. The third data line DLb is connected to the third driving unit DRb of the third color pixel PXb and is not connected to the first color pixel PXr and the second color pixel PXg. In the display device according to the exemplary embodiment, the data lines DLr, DLg, and DLb each are connected to the pixels displaying the same color, so the power consumption may be reduced. That is, the data line DLr is connected only to pixels PXr which display the same color (e.g., red color), not to PXg and PXb. The data line DLg is connected only to pixels PXg which display the same color (e.g., green color), not to PXr and PXb. The data line DLb is connected only to pixels PXb which display the same color (e.g., blue color), not to PXg and PXr Within one pixel, each of the driving units DRr, DRg, and DRb and the corresponding light emitting unit connected to each do not overlap each other. Each of the driving units DRr, DRg, and DRb overlap other light emitting units EDr, EDg, and EDb that are not connected thereto.

First, referring to the first pixel row, the second driving unit DRg, the first driving unit DRr, the second driving unit DRg, and the third driving unit DRb are sequentially and repeatedly disposed. The first light emitting unit EDr connected to the first driving unit DRr positioned in the second pixel column may overlap the second driving unit DRg positioned in the second pixel row and the first pixel column. That is, the first light emitting unit EDr may be connected to the first driving unit DRr adjacent to the first light emitting unit EDr in the third direction Dc3. The third direction Dc3 may be a diagonal direction between the first and second directions Dc1 and Dc2 and forming an acute angle with respect to the first direction Dc1. The second light emitting unit EDg connected to the second driving unit DRg positioned in the third pixel column may overlap the first driving unit DRr positioned in the second pixel row and the second pixel column. That is, the second light emitting unit EDg may be connected to the second driving unit DRg adjacent to the second light emitting unit EDg in the third direction Dc3. The third light emitting unit EDb connected to the third driving unit DRb positioned in the fourth pixel column overlaps the second driving unit DRg positioned in the second pixel row and the third pixel column. That is, the third light emitting unit EDb may be connected to the third driving unit DRb adjacent to the third light emitting unit EDb in the third direction Dc3. The second light emitting unit EDg connected to the second driving unit DRg positioned in the fifth pixel column overlap the third driving unit DRb positioned in the second pixel row and the fourth pixel column. That is, the second light emitting unit EDg may be connected to the second driving unit DRg adjacent to the second light emitting unit EDg in the third direction Dc3.

Next, referring to the second pixel row, the second driving unit DRg, the first driving unit DRr, the second driving unit DRg, and the third driving unit DRb are sequentially and repeatedly disposed. The second light emitting unit EDg connected to the second driving unit DRg positioned in the first pixel column overlaps the first driving unit DRr positioned in the third pixel row and the second pixel column. That is, the second light emitting unit EDg may be connected to the second driving unit DRg adjacent in the fourth direction Dc4. The fourth direction Dc4 may be a diagonal direction forming an obtuse angle with respect to the first direction Dc1. The first light emitting unit EDr connected to the first driving unit DRr positioned in the second pixel column overlaps the second driving unit DRg positioned in the third pixel row and the third pixel column. That is, the first light emitting unit EDr may be connected to the first driving unit DRr adjacent in the fourth direction Dc4. The second light emitting unit EDg connected to the second driving unit DRg positioned in the third pixel column overlaps the third driving unit DRb positioned in the third pixel row and the fourth pixel column in a plan view. That is, the second light emitting unit EDg may be connected to the second driving unit DRg adjacent in the fourth direction Dc4. The third light emitting unit EDb connected to the third driving unit DRb positioned in the fourth pixel column overlaps the third driving unit DRb positioned in the third pixel row and the fifth pixel column. That is, the third light emitting unit EDb may be connected to the third driving unit DRb adjacent in the fourth direction Dc4.

The light emitting units EDr, EDg, and EDb may include a first light emission group EGr1 and a second light emission group EGr2. The first light emission group EGr1 may include a first light emitting unit EDr, a second light emitting unit EDg, a third light emitting unit EDb, and a second light emitting unit EDg that are sequentially disposed in the first direction Dc1 (i.e., the positive first direction). In the second pixel row, the first light emission group EGr1 may be repeatedly disposed. The second light emission group EGr2 may include a third light emitting unit EDb, a second light emitting unit EDg, a first light emitting unit EDr, and a second light emitting unit EDg that are sequentially displaced along the first direction Dc1 (i.e., the positive first direction). In the third pixel row, the second light emission group EGr2 may be repeatedly disposed. By having such a pixel dispose structure, it is possible to achieve the high resolution with a small number of the pixels by sharing the adjacent pixels to express the colors.

While this disclosure has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

EGr1: first light emission group
EGr2: second light emission group
EDr: first light emitting unit
EDg: second light emitting unit
EDb: third light emitting unit
DRr: first driving unit
DRg: second driving unit
DRb: third driving unit
DLr, DL1: first data line
DLg, DL2: second data line
DLb, DL3: third data line

What is claimed is:
1. A display device comprising:
a first driving unit in a display area;
a first light emitting unit electrically connected to the first driving unit by a first pixel electrode;
a second driving unit in the display area;
a second light emitting unit electrically connected to the second driving unit;
a third driving unit in the display area; and
a third light emitting unit electrically connected to the third driving unit,
wherein the first light emitting unit emits a first color light,
the second light emitting unit emits a second color light, and
the third light emitting unit emits a third color light,
wherein the first light emitting unit comprises a first pixel electrode, and the first pixel electrode overlaps in a plan view the second driving unit connected to the second light emitting unit which emits the second color light,
wherein the second light emitting unit overlaps one of the first driving unit and the third driving unit in a plan view,
wherein the third light emitting unit overlaps the second driving unit in a plan view, and
the first light emitting unit, the second light emitting unit, and the third light emitting unit are disposed in the display area.

2. The display device of claim 1, further comprising:
a partition wall disposed on the first pixel electrode and having a first opening overlapping a part of the first pixel electrode,
wherein the first opening overlaps the second driving unit.

3. The display device of claim 2, wherein the first pixel electrode overlaps at least a part of the first driving unit and the second driving unit.

4. The display device of claim 2, wherein the first light emitting unit comprises a first emitting layer disposed on the first pixel electrode, and the first emitting layer overlaps the second driving unit.

5. The display device of claim 1,
the second light emitting unit comprises a second pixel electrode, and
the second pixel electrode overlaps the first driving unit or the third driving unit.

6. The display device of claim 5, further comprising:
a partition wall disposed on the second pixel electrode and having a second opening overlapping a part of the second pixel electrode,
wherein the second opening overlaps the first driving unit or the third driving unit.

7. The display device of claim 5, wherein the second pixel electrode overlaps at least a part of the second driving unit and the first driving unit.

8. The display device of claim 5, wherein the second pixel electrode overlaps at least a part of the second driving unit and the third driving unit.

9. The display device of claim 5, wherein the second light emitting unit comprises a second emitting layer disposed on the second pixel electrode, and the second emitting layer overlaps the first driving unit or the third driving unit.

10. The display device of claim 1, wherein the first light emitting unit, the second light emitting unit, the third light emitting unit, and the second light emitting unit are sequentially disposed according to a first direction.

11. The display device of claim 1, wherein the second driving unit, the first driving unit, the second driving unit and the third driving unit are sequentially disposed according to the first direction.

12. A display device comprising:
a first driving unit;
a first pixel electrode electrically connected to the first driving unit;
a second driving unit;
a second pixel electrode electrically connected to the second driving unit;
a third driving unit; and
a third pixel electrode electrically connected to the third driving unit,
wherein the first pixel electrode overlaps in a plan view at least a part of the second driving unit,
wherein the second light emitting unit overlaps one of the first driving unit and the third driving unit in a plan view,
wherein the third light emitting unit overlaps the second driving unit in a plan view;
wherein the first light emitting unit, the second light emitting unit, and the third light emitting unit are disposed in the display area, and
wherein the first driving unit, the second driving unit, and the third driving unit are disposed in the display area.

13. The display device of claim 12, further comprising:
a partition wall disposed on the first pixel electrode and having a first opening overlapping the first pixel electrode,
wherein the first opening overlaps the second driving unit.

14. The display device of claim 13, wherein the first light emitting unit comprises a first emitting layer disposed on the first pixel electrode, and the first emitting layer overlaps the second driving unit.

15. The display device of claim 12, further comprising:
a first data line electrically connected to the first driving unit,
a second data line electrically connected to the second driving unit, and
a third data line electrically connected to the third driving unit.

16. The display device of claim 15, wherein the first data line is disposed between the first driving unit and the second driving unit, and the third data line is disposed between the second driving unit and the third driving unit.

17. The display device of claim 12, further comprising:
a first light emitting unit comprising the first pixel electrode and emitting a first color light,
a second light emitting unit comprising the second pixel electrode and emitting a second color light, and
a third light emitting unit comprising the third pixel electrode and emitting a third color light.

18. The display device of claim 17, wherein the first light emitting unit, the second light emitting unit, the third light emitting unit, and the second light emitting unit are sequentially disposed according to the first direction.

19. The display device of claim 17, wherein the second driving unit, the first driving unit, the second driving unit and the third driving unit are sequentially disposed according to the first direction.

* * * * *